(12) United States Patent
He et al.

(10) Patent No.: US 11,373,949 B2
(45) Date of Patent: Jun. 28, 2022

(54) INTERCONNECT STRUCTURE HAVING METAL LAYERS ENCLOSING A DIELECTRIC

(71) Applicants: Semiconductor Manufacturing International (Shanghai) Corporation, Shanghai (CN); Ningbo Semiconductor International Corporation, Ningbo (CN)

(72) Inventors: Zuopeng He, Shanghai (CN); Ji Guang Zhu, Shanghai (CN)

(73) Assignees: Semiconductor Manufacturing International (Shanghai) Corporation, Shanghai (CN); Ningbo Semiconductor International Corporation, Ningbo (CN)

( * ) Notice: Subject to any disclaimer, the term of this patent is extended or adjusted under 35 U.S.C. 154(b) by 90 days.

(21) Appl. No.: 16/734,610

(22) Filed: Jan. 6, 2020

(65) Prior Publication Data

US 2020/0144175 A1 May 7, 2020

Related U.S. Application Data

(62) Division of application No. 15/716,261, filed on Sep. 26, 2017, now Pat. No. 10,553,536.

(30) Foreign Application Priority Data

Nov. 29, 2016 (CN) .......................... 201611066883.1

(51) Int. Cl.
*H01L 23/528* (2006.01)
*H01L 23/522* (2006.01)
(Continued)

(52) U.S. Cl.
CPC ...... *H01L 23/528* (2013.01); *H01L 21/76846* (2013.01); *H01L 21/76871* (2013.01);
(Continued)

(58) Field of Classification Search
CPC ............. H01L 23/5283; H01L 23/5226; H01L 21/76818; H01L 21/76877;
(Continued)

(56) References Cited

U.S. PATENT DOCUMENTS 4,687,552 A * 8/1987 Early ................ H01L 21/76879
205/125
5,840,625 A 11/1998 Feldner
(Continued)

FOREIGN PATENT DOCUMENTS

CN 1242107 A 1/2000
CN 1412821 A 4/2003
(Continued)

OTHER PUBLICATIONS

Jaeger, Richard C., "Introduction to Microelectronic Fabrication", Addison-Wesley Publishing Company, ISBN 0-201-14695-9, pp. 18-21, reprinted May 1993.
(Continued)

*Primary Examiner* — Younes Boulghassoul
(74) *Attorney, Agent, or Firm* — Anova Law Group, PLLC

(57) ABSTRACT

Interconnect structures are provided. An interconnect structure includes a substrate; a first dielectric layer on the substrate and including an opening for a first interconnect layer extending to the substrate; a first metal layer having a first portion in the opening and a second portion in contact with the first portion and on a portion of the first dielectric layer adjacent to the opening; a second dielectric layer on the first dielectric layer and on the first metal layer, the second
(Continued)

dielectric layer including a trench for a second interconnect layer, the trench exposing the second portion of the first metal layer; and a second metal layer in the trench, wherein the second portion of the first metal layer forms a lower portion of the second interconnect layer.

10 Claims, 7 Drawing Sheets

(51) Int. Cl.
    *H01L 23/532*     (2006.01)
    *H01L 21/768*     (2006.01)
    *H01L 21/32*     (2006.01)
    *H01L 21/3205*     (2006.01)
    *H01L 21/321*     (2006.01)

(52) U.S. Cl.
    CPC .. *H01L 21/76877* (2013.01); *H01L 21/76885* (2013.01); *H01L 21/76897* (2013.01); *H01L 23/5226* (2013.01); *H01L 23/5283* (2013.01); *H01L 23/53238* (2013.01); *H01L 21/32* (2013.01); *H01L 21/32051* (2013.01); *H01L 21/32115* (2013.01)

(58) Field of Classification Search
    CPC ........... H01L 21/76879; H01L 21/7688; H01L 21/76883; H01L 21/76885; H01L 21/76897; H01L 21/76814; H01L 21/76807–76813; H01L 2221/1015–1036; H01L 21/76843; H01L 21/76846; H01L 21/76847; H01L 21/76849; H01L 21/7685; H01L 21/76852; H01L 21/76865; H01L 21/76871; H01L 21/76873; H01L 23/53228–53238
    See application file for complete search history.

(56) References Cited

U.S. PATENT DOCUMENTS

| | | | |
|---|---|---|---|
| 5,920,790 A | 7/1999 | Wetzel et al. | |
| 6,028,362 A | 2/2000 | Omura | |
| 6,352,917 B1 | 3/2002 | Gupta et al. | |
| 6,359,328 B1 | 3/2002 | Dubin | |
| 6,376,370 B1 * | 4/2002 | Farrar | H01L 21/76885 438/678 |
| 6,426,558 B1 * | 7/2002 | Chapple-Sokol | H01L 23/5226 257/758 |
| 6,670,271 B1 | 12/2003 | Subramanian et al. | |
| 9,412,648 B1 | 8/2016 | Shiu et al. | |
| 2005/0153505 A1 * | 7/2005 | Gambino | H01L 21/02167 438/233 |
| 2006/0291029 A1 * | 12/2006 | Lin | H01L 23/5223 257/622 |
| 2006/0292851 A1 | 12/2006 | Lin et al. | |
| 2008/0261155 A1 * | 10/2008 | Borzenko | H01L 21/7682 430/311 |
| 2012/0021602 A1 | 1/2012 | Ko | |
| 2012/0299188 A1 | 11/2012 | Chen et al. | |
| 2012/0319278 A1 | 12/2012 | Lin et al. | |
| 2012/0329272 A1 | 12/2012 | Arnold et al. | |
| 2013/0127584 A1 * | 5/2013 | Filippi | H01L 23/53295 337/297 |
| 2013/0292835 A1 * | 11/2013 | King | H01L 23/5222 257/741 |
| 2014/0035142 A1 | 2/2014 | Yang et al. | |
| 2014/0084481 A1 * | 3/2014 | Zhang | H01L 21/76831 257/774 |
| 2017/0170110 A1 * | 6/2017 | Chang | H01L 21/7684 |
| 2017/0309563 A1 * | 10/2017 | Zang | H01L 23/5223 |
| 2018/0151421 A1 * | 5/2018 | Chen | H01L 21/76831 |

FOREIGN PATENT DOCUMENTS

| | | |
|---|---|---|
| CN | 1885524 A | 12/2006 |
| CN | 105789114 A | 7/2016 |
| CN | 107026115 A | 8/2017 |
| EP | 0226385 A1 | 6/1987 |
| EP | 1737037 A2 | 12/2006 |

OTHER PUBLICATIONS

European Application No. 17203759.0, Extended European Search Report dated May 3, 2018, 9 pages.

* cited by examiner

INTERCONNECT STRUCTURE HAVING METAL LAYERS ENCLOSING A DIELECTRIC

CROSS-REFERENCES TO RELATED APPLICATIONS

This application is a divisional of U.S. patent application Ser. No. 15/716,261, filed on Sep. 26, 2017, which claims the priority of Chinese patent application No. 201611066883.1, filed on Nov. 29, 2016, the entirety of which is incorporated herein by reference.

FIELD OF THE DISCLOSURE

The present disclosure generally relates to the field of semiconductor technology and, more particularly, relates to an interconnect structure and a method for manufacturing the same.

BACKGROUND

For reducing device feature sizes, current techniques generally employ Damascene processes for forming an interconnect structure. A conventional process of manufacturing an interconnect structure may include the steps of first forming an opening in a dielectric layer on a substrate, and then depositing a barrier layer and a seed layer on the surface of the dielectric layer and on the surface of the opening. Thereafter, a metal layer is deposited using an electroplating process to fill the opening and to cover the seed layer on the dielectric layer, and then a planarization process is performed on the deposited metal layer.

BRIEF SUMMARY OF THE DISCLOSURE

One aspect of the present disclosure includes an interconnect structure, including a substrate; a first dielectric layer on the substrate and including an opening for a first interconnect layer extending to the substrate; a first metal layer having a first portion in the opening and a second portion in contact with the first portion and on a portion of the first dielectric layer adjacent to the opening; a second dielectric layer on the first dielectric layer and on the first metal layer, the second dielectric layer including a trench for a second interconnect layer, the trench exposing the second portion of the first metal layer; and a second metal layer in the trench, wherein the second portion of the first metal layer forms a lower portion of the second interconnect layer.

Another aspect of the present disclosure provides an interconnect structure, including a substrate; a first dielectric layer formed on the substrate and a first metal layer formed on the substrate. The first dielectric layer includes a first dielectric portion and second dielectric portions isolated from the first dielectric portion. The first dielectric portion has a top surface lower than the second dielectric portions. The first metal layer includes a first metal portion and second metal portions. The first metal portion is between the second metal portions. The first metal portion and the substrate together enclose the first dielectric portion. A second dielectric layer is formed on the first metal portion. A second metal layer is formed on the second dielectric layer and contacting on the second metal portions.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
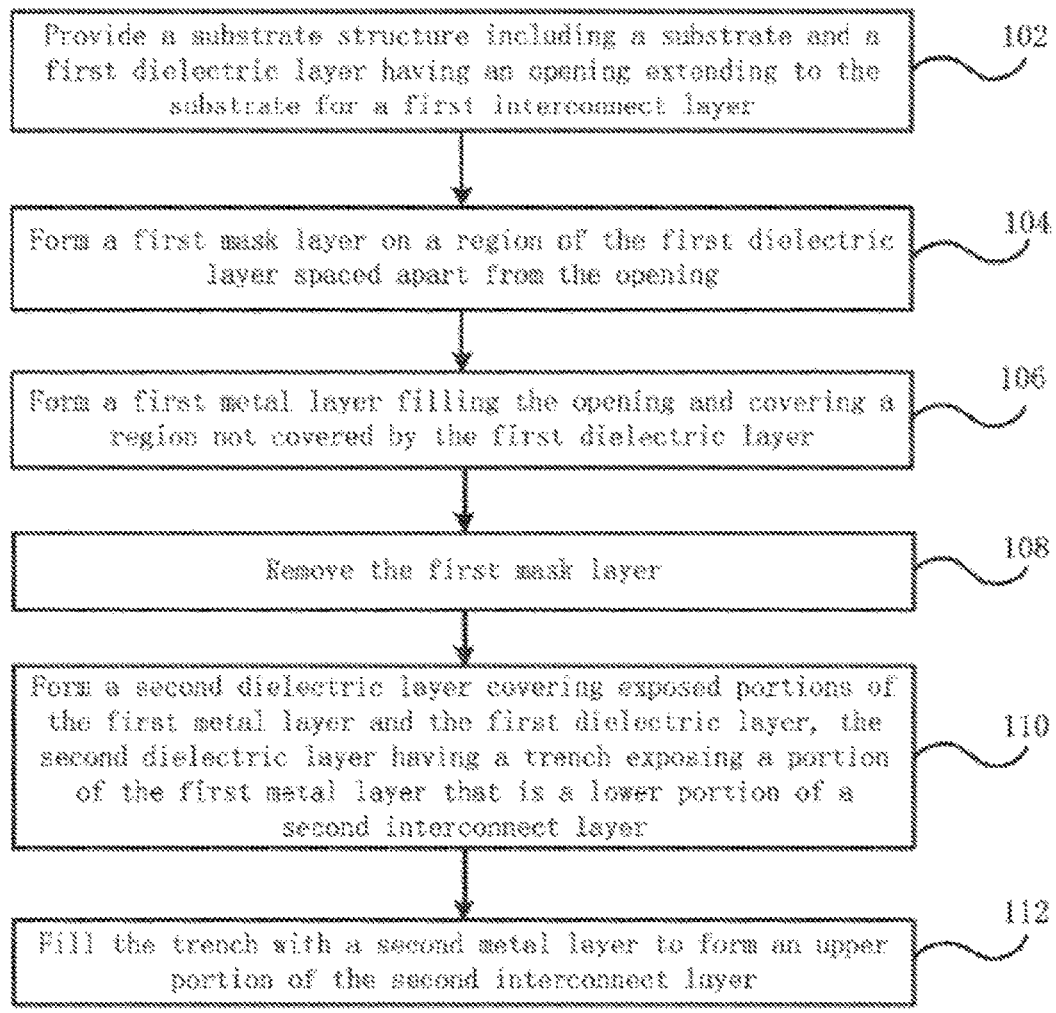
FIG. 1 is a simplified flowchart of a method for manufacturing an interconnect structure according to an embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. In the drawings, like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessarily include the particular feature, structure or characteristic. As used throughout this disclosure, the terms "depositing" and "forming" are used interchangeably. The terms "substrate" and "wafer" are used interchangeably.

It should be noted that like reference numerals are used to denote like elements, and once an element has been defined in drawings, it will not be further described in other drawings.

Embodiments of the present invention now will be described more fully hereinafter with reference to the accompanying drawings, in which embodiments of the invention are shown. This invention may, however, be embodied in many different forms and should not be construed as limited to the embodiments set forth herein.

Various embodiments of the present disclosure provides a method that does not blanket deposit a metal layer on the entire surface of the substrate, i.e., the method shields some portions of the substrate from the deposited metal layer, so that the amount of the deposited metal layer is reduced, thereby reducing the stress in the deposited metal layer.

FIG. 1 is a simplified flowchart of a method for manufacturing an interconnect structure according to an embodiment of the present invention. FIGS. 2 to 11 are cross-sectional views illustrating intermediate stages of an interconnect structure in a manufacturing method according to an embodiment of the present invention. A method for manufacturing an interconnect structure according to an embodiment of the present invention will be described below with reference to FIGS. 1 and 2 to 11.

Figure 2:
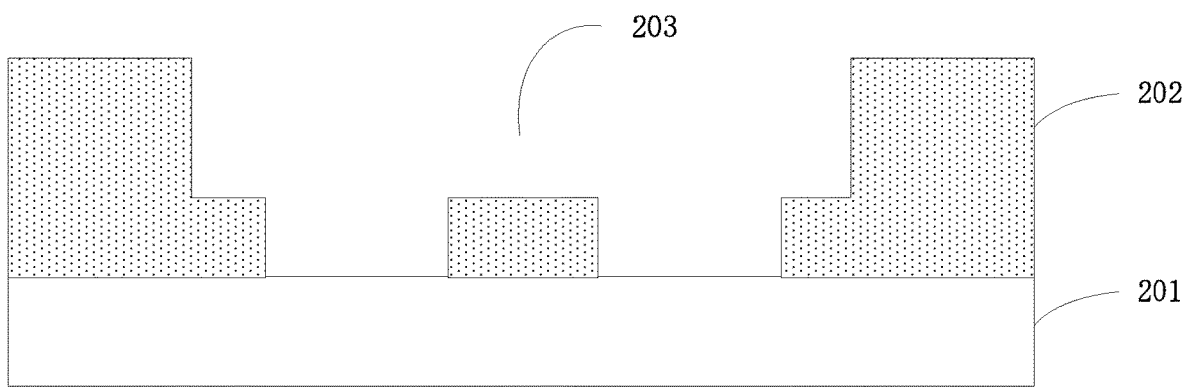
FIGS. 2 to 10, and FIGS. 11A-11B are cross-sectional views illustrating intermediate stages of an interconnect structure in a manufacturing method according to an embodiment of the present invention.

Referring to FIG. 1, a substrate structure is provided in step 102. Referring to FIG. 2, the substrate structure may include a substrate 201 and a dielectric layer 202 on substrate 201. Dielectric layer 202 includes an opening 203 for a first interconnect layer extending to substrate 201. Substrate 201 may include a variety of different devices, such as metal oxide semiconductor (MOS) devices, passive devices (e.g., capacitors, inductors, and the like), etc. Substrate 201 may include a semiconductor layer (e.g., silicon, germanium, gallium arsenide, and the like) and a device layer on the semiconductor layer. In one embodiment, opening 203 may include a groove extending into first dielectric layer 202 and a via disposed below the groove and extending to substrate 201. In some embodiments, the via may include one, two, or more through holes. It should be noted that opening 203 can be formed using conventional damascene processes that are compatible with existing semiconductor fabrication processes and will not be described herein for the sake of brevity.

Figure 3:
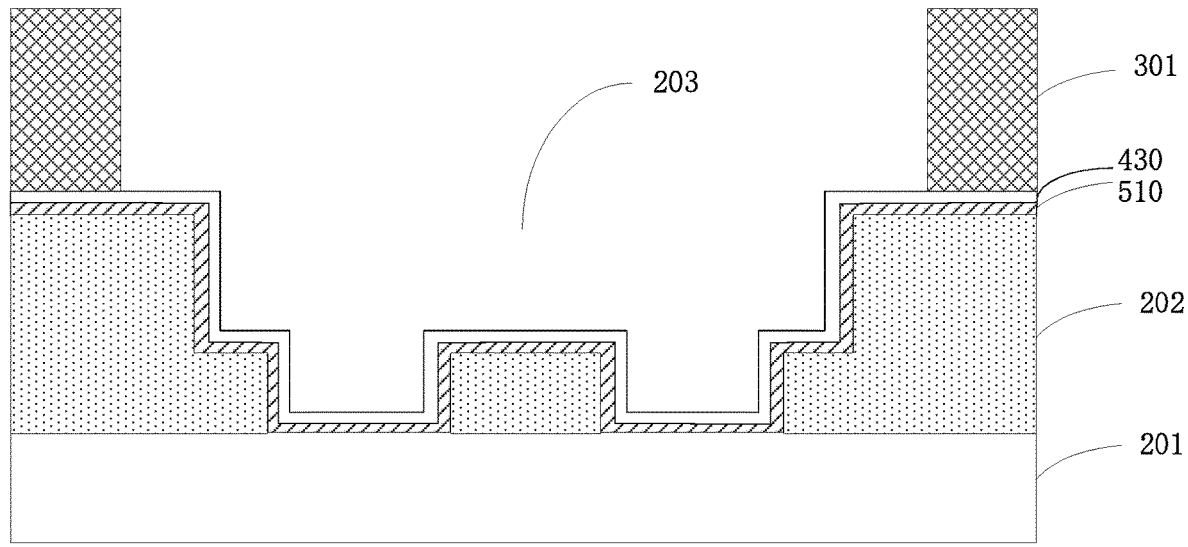

Next, in step 104, a first mask layer 301 (e.g., a photoresist) is formed on a region of first dielectric layer 202 spaced apart from the opening, as shown in FIG. 3.

In one embodiment, prior to forming first mask layer 301 on a region of first dielectric layer 202 spaced apart from opening 203, a first barrier layer 510 may be formed on the substrate structure shown in FIG. 2. First mask layer 301 is formed on the first barrier layer 510. The first barrier layer 510 is formed on the bottom and sidewalls of opening 203 and on the surface of first dielectric layer 202. In one embodiment, the first barrier layer 510 may include TaN, Ta, or stacked layers of TaN and Ta. In a specific embodiment, the method may also include forming a first seed layer 430 on the first barrier layer 510, so that the first mask layer 301 is formed on the first seed layer 430. The first seed layer 430 may include copper. The first barrier layer 510 and the first seed layer 430 each may be formed using a physical vapor deposition (PVD) process.

Figure 4:
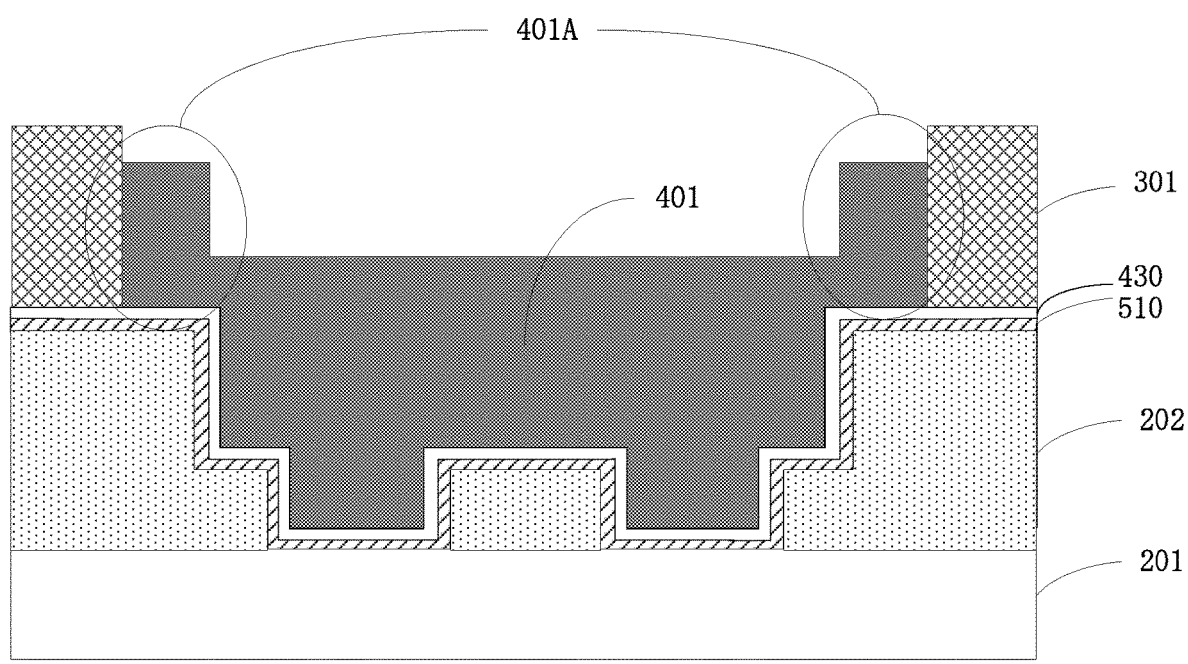

Next, in step 106, a first metal layer (e.g., copper) 401 is formed filling opening 401 and covering the surface area of first dielectric layer 202 not covered by first mask layer 301, as shown in FIG. 4. In one embodiment, first metal layer 401 may be deposited using an electroplating process.

In the embodiment, first metal layer 401 filling opening 203 forms a first interconnect layer. The first interconnect layer includes a lower portion formed of a via filled with the first metal layer and an upper portion formed of a groove filled with the first metal layer. The region of first dielectric layer 202 not covered by first mask layer 301 includes a step-shaped structure. First metal layer 401 is conformally deposited on the step-shaped structure to form a conformal region 401A, which is indicated by a circle. Conformal region 401A is adjacent to first mask layer 301. In the embodiment, conformal region 401A of the first metal layer adjacent to first mask layer 301 may serve as a lower portion of a second interconnect layer, which is typically formed later by filling a via of the second interconnect layer. Since first mask layer 301 covers a portion of first dielectric layer 202, the amount of electro-plated first metal layer 401 is substantially reduced with respect to the amount of a metal layer that is blanket formed on the dielectric layer, thereby reducing the stress in a subsequently formed interconnect structure, reducing the manufacturing cost, and improving the reliability of the interconnect structure.

Figure 5:
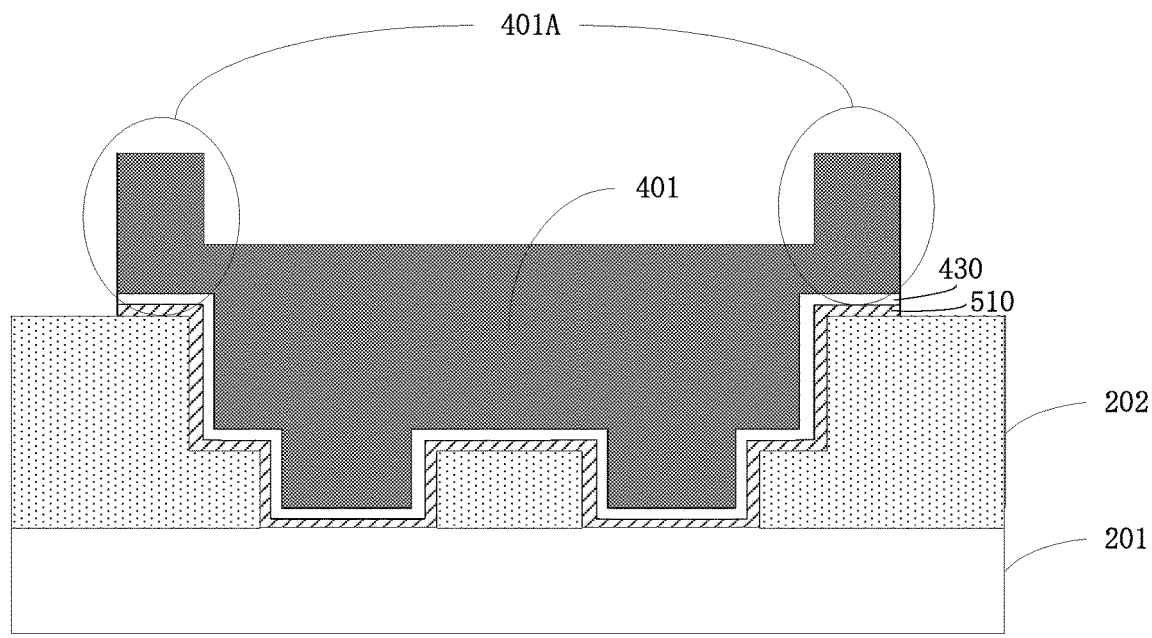

Next, in step 108, first mask layer 301 is removed exposing a portion of first dielectric layer 202, as shown in FIG. 5. It should be noted that, in the case where a seed layer and/or a first barrier layer are formed below first mask layer 301, the exposed portions of the first seed layer and the first barrier layers are also removed after the removal of first mask layer 301.

Next, in step 110, a second dielectric layer 601 is formed covering the exposed portions of first metal layer 401 and first dielectric layer 202. The second dielectric layer 601 includes a trench 701 for a second interconnect layer exposing a portion of conformal region 401A, conformal region 401A serves as a lower portion of a second interconnect layer.

Figure 6:
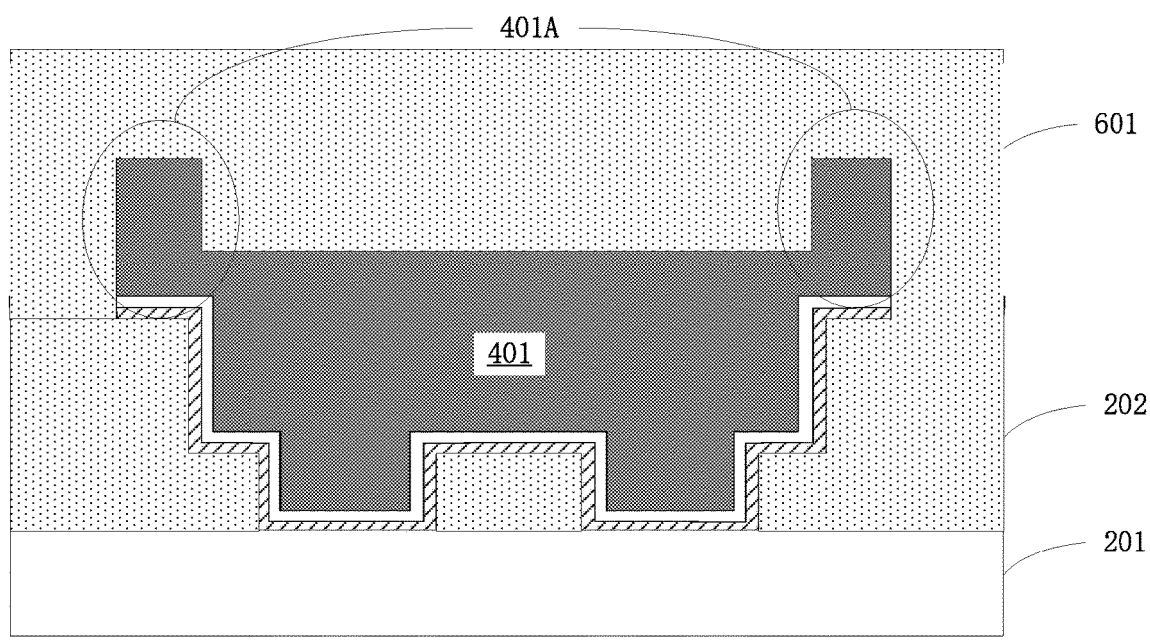

In one embodiment, referring to FIG. 6, deposited second dielectric layer 601 covers the exposed portions of first metal layer 401 and first dielectric layer 202. In one embodiment, second dielectric layer 601 may include silicon oxide, silicon nitride, or the like. Second dielectric layer 601 may be of the same material as or different material from first dielectric layer 202.

Figure 7:
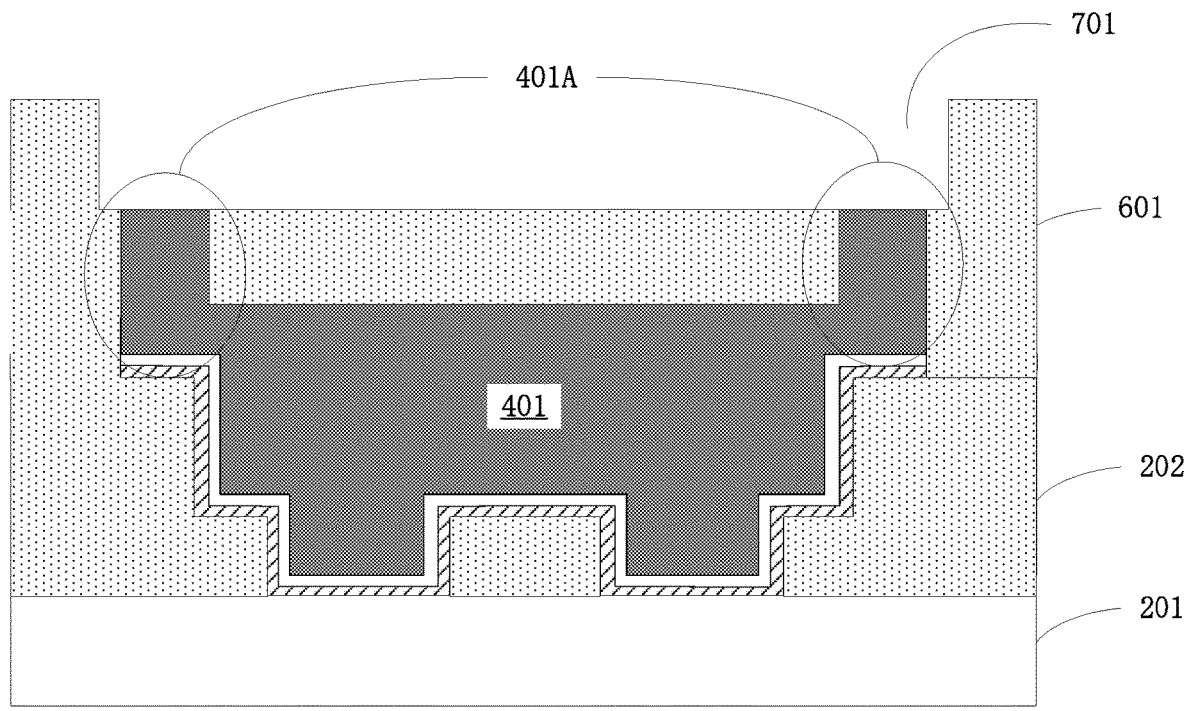

Next, referring to FIG. 7, second dielectric layer 601 is etched to form a trench 701 for a second interconnect layer. In one embodiment, a patterned hardmask layer may be formed on second dielectric layer 601 defining the shape of trench 701, an etch process is performed on second dielectric layer 601 using the patterned hardmask layer as a mask to form trench 701. Trench 701 exposes a surface of portion 401A of first metal layer 401 and exposes a portion of the second dielectric layer 601. As shown in FIG. 7, the exposed surface of the portion 401A and the exposed surface of the portion of the second dielectric layer 601 at the bottom of the trench 701 are coplanar with each other. Thereafter, the patterned hardmask layer is removed.

Next, in step 112, the method further includes forming a second metal layer (e.g., copper) filling trench 701 to form an upper portion of the second interconnect layer. In one embodiment, the second metal layer may be deposited using an electroplating process to fill trench 701.

In one embodiment, the upper portion of the second interconnect layer may be formed by first depositing a second metal layer filling the trench and covering a remaining second dielectric layer (the remaining second dielectric layer is the second dielectric layer having a portion removed to form the trench). A planarization process is then performed until the upper surface of the remaining second metal layer is substantially flush with the upper surface of the second dielectric layer. Note that in this context, the term "substantially flush" refers to that the lateral surfaces are flush (coplanar) with each other within the range of process variation.

In another embodiment, the upper portion of the second interconnect layer may be formed with reference to FIGS. 8 through 11.

Figure 8:
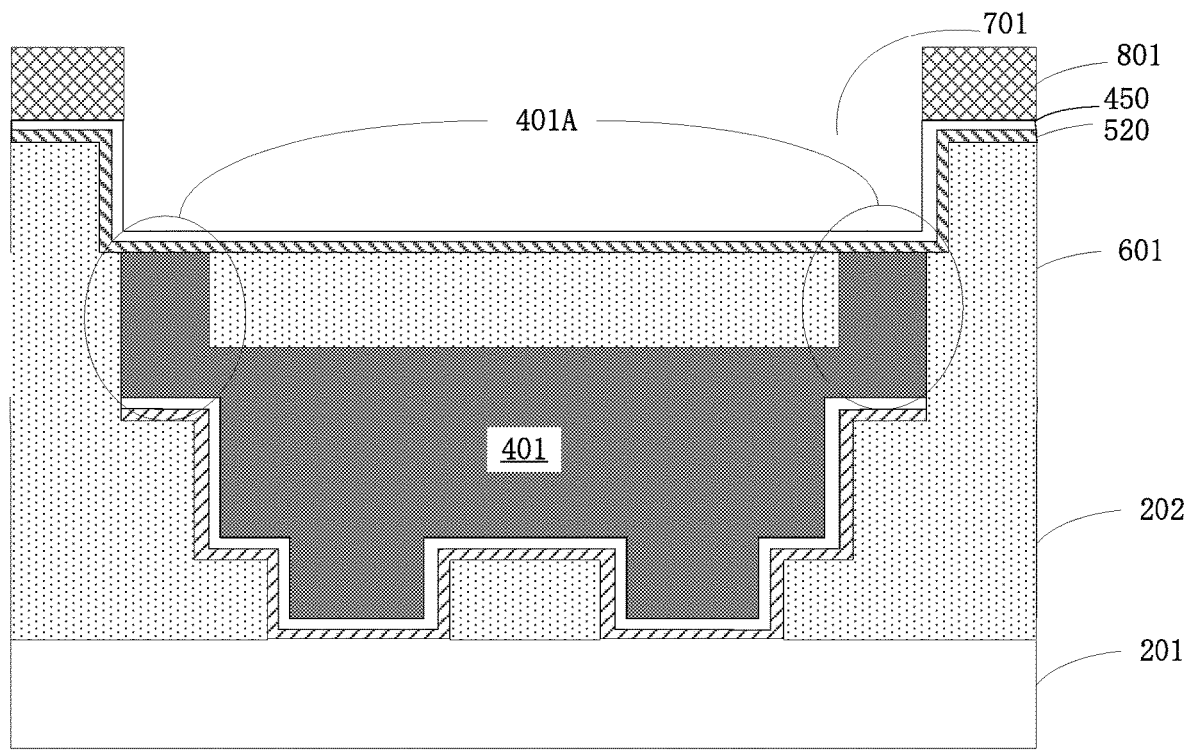

Referring to FIG. 8, a second mask layer 801 (e.g., a photoresist) is formed on a portion of remaining second dielectric layer 601. In one embodiment, prior to forming second mask layer 801 on a portion of remaining second dielectric layer 601, the method may include forming a second barrier layer 520 on remaining second dielectric layer 601, and on the bottom and sidewalls of trench 701, such that second mask layer 801 is formed on the second barrier layer 520. In one embodiment, the second barrier layer 520 may include TaN, Ta, or stacked layers of TaN and Ta. In a specific embodiment, the method may also include forming a second seed layer 450 on the second barrier layer 520, so that second mask layer 801 is formed on the second seed layer 450. The second seed layer 450 may include copper. Similar to the first barrier and seed layers, the second barrier layer 520 and the second seed layer 450 each may be formed using a physical vapor deposition (PVD) process.

Figure 9:
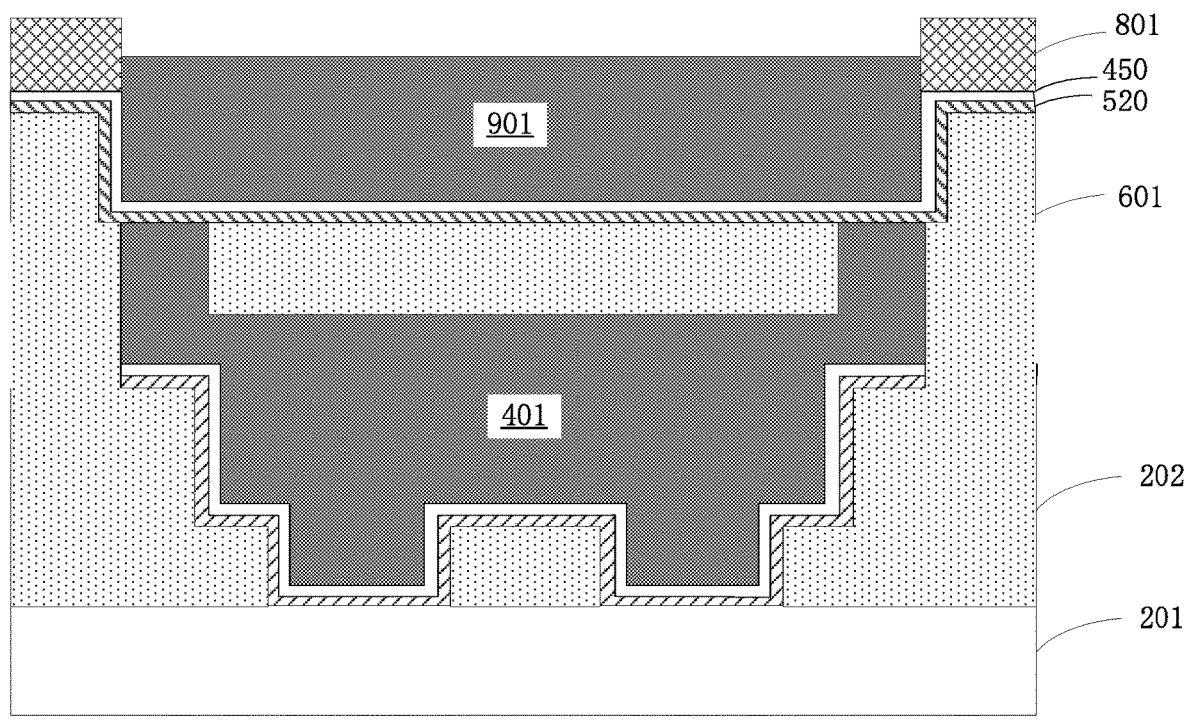

Referring to FIG. 9, the method includes depositing a second metal layer 901 filling trench 701. Since second mask layer 801 is formed on at least one portion of remaining dielectric layer 601, the amount of deposited second metal layer 901 is reduced, further reducing the stress of the second interconnect layer, facilitating a subsequent planarization process, and reducing the cost of the planarization process.

Figure 10:
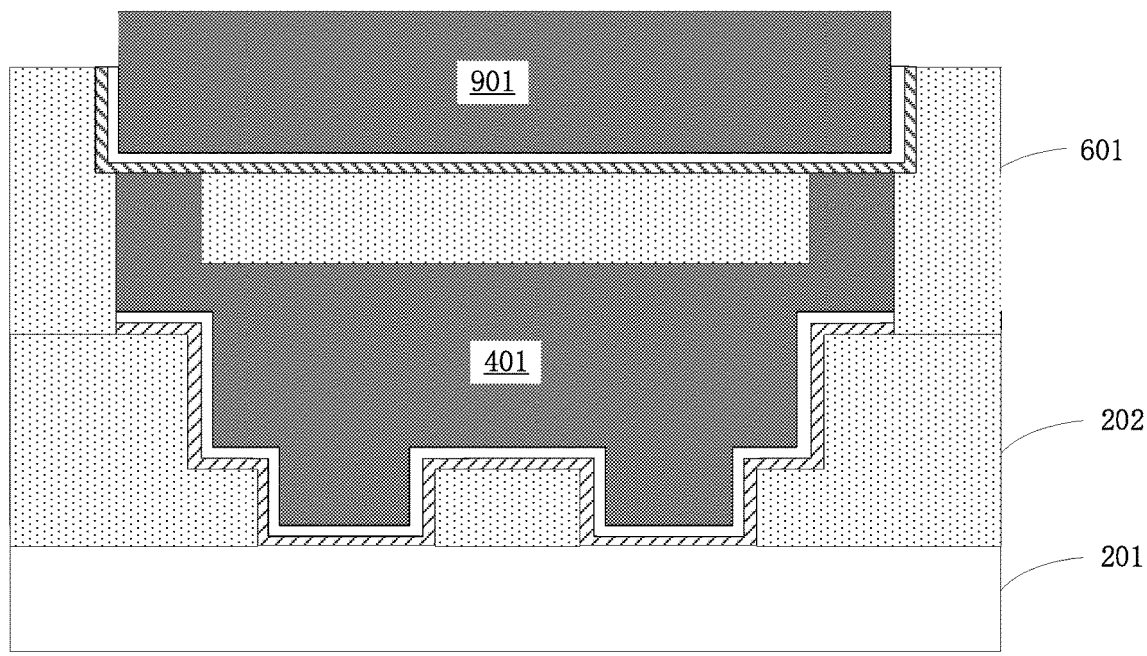

Referring to FIG. 10, second mask layer 801 is removed. It is noted that in the case where a second seed layer and/or a second barrier layer are formed below second mask layer 801, after the removal of second mask layer 801, exposed portions of the second seed layer and the second barrier layer are also removed.

Figure 11A:
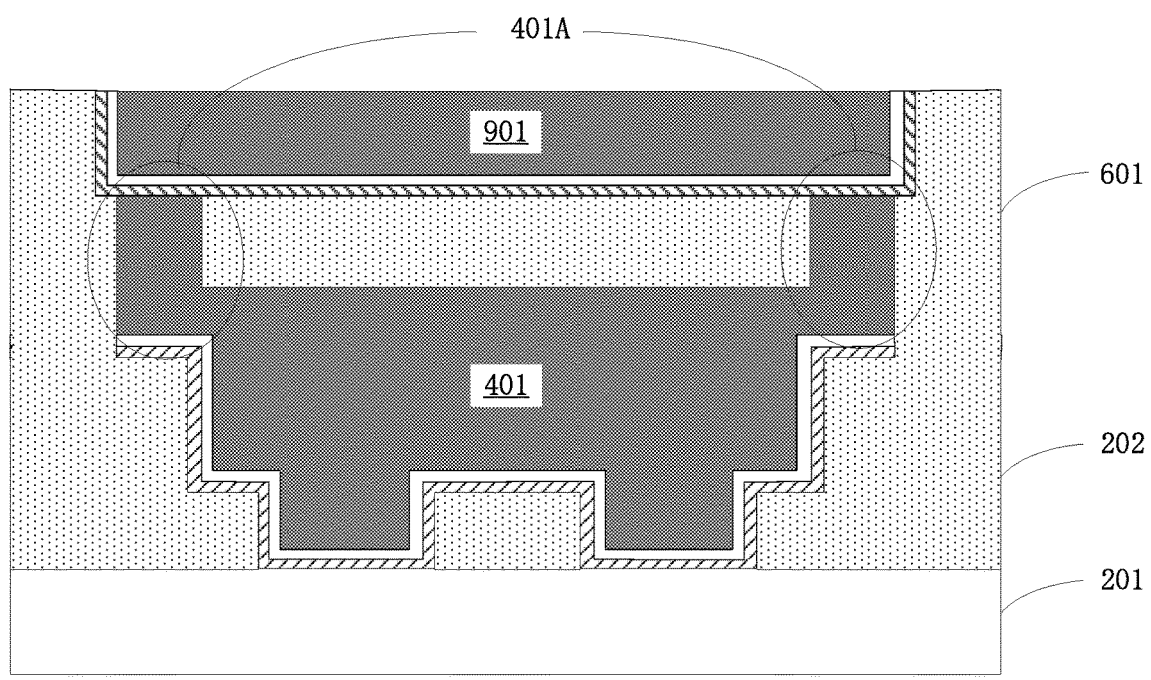
Figure 11B:
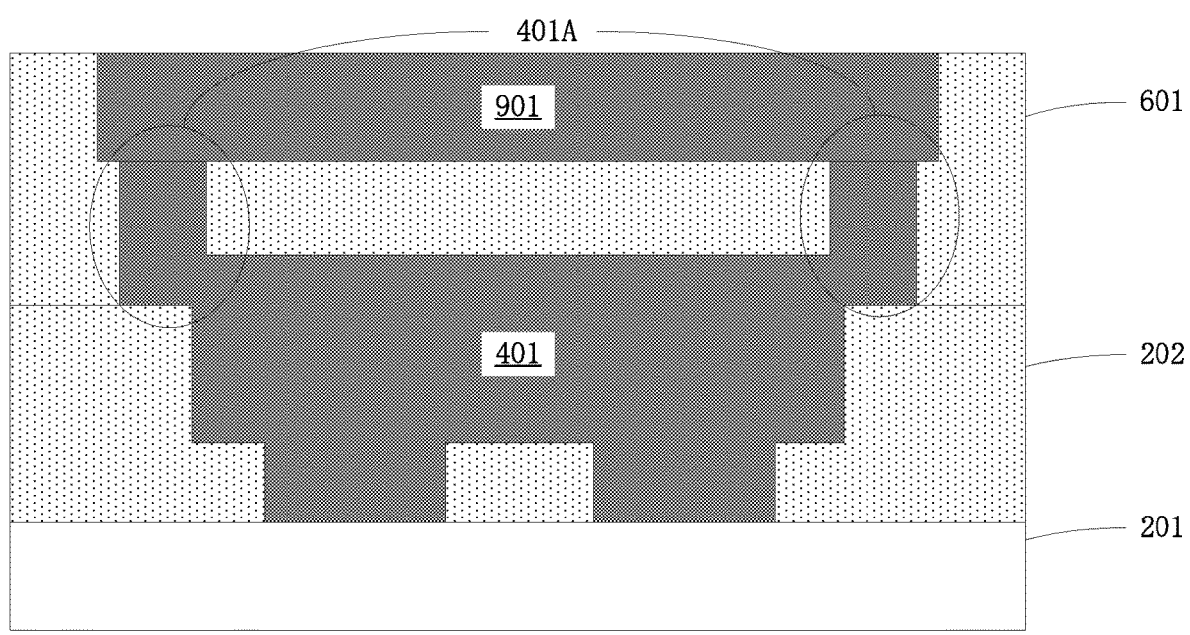

Referring to FIGS. 11A-11B a planarization process is performed on second metal layer 901, so that the upper surface of a remaining second metal layer 901 is substantially flush with the upper surface of second dielectric layer 601.

In accordance with the present invention, the method of manufacturing an interconnect structure provides forming a first mask layer on a portion of the first dielectric layer to reduce an amount of a first metal layer subsequently deposited on the first dielectric layer, thereby saving process costs, reducing the stress in the first metal layer, and reducing the stress in the first interconnect layer, so that the reliability and stability of the interconnect structure will be improved. In addition, a lower portion of a second interconnect layer may also be formed at the same time when the first metal layer is deposited, thus eliminating the need for photolithography and etch processes when forming through holes of the second interconnect structure to reduce process costs. As used herein, portion 401A of first metal layer 401 is the lower portion of the second interconnect layer.

The method of the present invention is particularly suitable for manufacturing integrated passive devices (IPD), but is not limited thereto.

Embodiments of the present invention also provide an interconnect structure. Referring to FIGS. 11A-11B, the interconnect structure includes a substrate 201, and a first dielectric layer 202 having an opening extending to substrate 201 and configured to be used for a first interconnect layer. In one embodiment, the opening may include a groove extending into the first dielectric layer and at least one through hole disposed below the groove.

The interconnect structure also includes a first metal layer 401 (e.g., copper) filling the opening and covering a portion of first dielectric layer 202 adjacent to the opening. A portion 401A of first metal layer 401 covering the portion of first dielectric layer adjacent to the opening adjacent is a lower portion of a second interconnect layer. In the embodiment, the portion of first metal layer 401 filling opening 203 is the first interconnect layer, and the lower portion of the second interconnect layer is integrally formed with the first interconnect layer. In one embodiment, the first metal layer has a first portion in the portion and a second portion in contact with the first portion and on a portion of the first dielectric layer adjacent to the opening.

The interconnect structure further includes a second dielectric layer 601 on first dielectric layer 202 and on first metal layer 401. Second dielectric layer 601 has a trench for the second interconnect layer. The trench in second dielectric layer 601 exposes an upper surface of lower portion 401A of the second interconnect layer.

The interconnect structure also includes a second metal layer 901 (e.g., copper) filling the trench.

In some embodiments, the interconnect structure may also include a first barrier layer 510 disposed on the bottom and sidewalls of the opening. The first metal layer is on the first barrier layer 510. In one embodiment, the interconnect structure may also include a first seed layer 430 disposed between the first barrier layer 510 and first metal layer 401, and the first metal layer is on the first seed layer 430.

In some embodiments, the interconnect structure may also include a second barrier layer 520 disposed on the bottom and sidewalls of the trench in second dielectric layer 601. In one embodiment, the interconnect structure may further include a second seed layer 450 disposed between the second barrier layer 520 and second metal layer 901.

In summary, embodiments of the present invention provide an interconnect structure and a manufacturing method thereof. In order not to obscure the teachings of the present invention, details of processes and structures known in the art are not described.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical applications. Many embodiments will be apparent to those of skill in the art upon reviewing the above description. The scope of the invention should, therefore, be determined not with reference to the above description, but instead should be determined with reference to the appended claims along with their full scope of equivalent.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An interconnect structure, comprising:
a substrate;
a first dielectric layer formed on the substrate and a first metal layer formed on the substrate, wherein:
the first dielectric layer includes a first dielectric portion and second dielectric portions isolated from the first dielectric portion, and the first dielectric portion has a top surface lower than the second dielectric portions, and
the first metal layer includes a first metal portion and second metal portions, the first metal portion is between the second metal portions, and the first metal portion and the substrate together enclose the first dielectric portion;
a second dielectric layer, formed on the first metal portion of the first metal layer and having a top surface coplanar with top surfaces of the second metal portions of the first metal layer; and
a second metal layer, formed on the second dielectric layer and contacting on the second metal portions.

2. The structure according to claim 1, wherein:
each second metal portion of the first metal layer is formed partially on a top surface of a corresponding second dielectric portion.

3. The structure according to claim 2, wherein:
the second dielectric layer is further formed on a remaining portion of the top surface of each corresponding second dielectric portion.

4. The structure according to claim 1, further including:
a first barrier layer, formed under a bottom surface of the first metal layer.

5. The structure according to claim 4, further including:
a first seed layer, formed between the first metal layer and the first barrier layer.

6. The structure according to claim 5, wherein:
the first seed layer and the first barrier layer are further formed partially on the top surface of the second dielectric portions.

7. The structure according to claim 1, further including:
a second barrier layer, formed under a bottom surface of the second metal layer.

8. The structure according to claim 7, further including:
a second seed layer, formed between the second metal layer and the second barrier layer.

9. The structure according to claim 1, wherein the first metal layer and the second metal layer each comprise copper.

10. The structure according to claim 1, wherein the first metal layer includes a damascene structure.

* * * * *